US008673784B2

(12) United States Patent
Okuuchi et al.

(10) Patent No.: US 8,673,784 B2
(45) Date of Patent: Mar. 18, 2014

(54) METHOD FOR PRODUCING SILICON EPITAXIAL WAFER

(75) Inventors: Shigeru Okuuchi, Tokyo (JP); Shinichi Ogata, Tokyo (JP)

(73) Assignee: Sumco Corporation, Tokyo (JP)

( * ) Notice: Subject to any disclaimer, the term of this patent is extended or adjusted under 35 U.S.C. 154(b) by 44 days.

(21) Appl. No.: 13/264,057

(22) PCT Filed: Apr. 12, 2010

(86) PCT No.: PCT/JP2010/056517
§ 371 (c)(1),
(2), (4) Date: Oct. 12, 2011

(87) PCT Pub. No.: WO2010/119833
PCT Pub. Date: Oct. 21, 2010

(65) Prior Publication Data
US 2012/0034850 A1  Feb. 9, 2012

(30) Foreign Application Priority Data
Apr. 13, 2009  (JP) ................. 2009-096800

(51) Int. Cl.
*H01L 21/461* (2006.01)
(52) U.S. Cl.
USPC ........... 438/692; 438/607; 438/690; 438/691; 216/90
(58) Field of Classification Search
USPC ......... 438/690, 691, 692, 693, 694, 695, 697, 438/416, 442, 607; 216/89, 90
See application file for complete search history.

(56) References Cited

U.S. PATENT DOCUMENTS

| | | | |
|---|---|---|---|
| 3,436,259 A | 4/1969 | Regh et al. | |
| 5,821,167 A | 10/1998 | Fukami et al. | |
| 6,051,498 A | 4/2000 | Pietsch et al. | |
| 6,863,595 B1 * | 3/2005 | Zagrebelny | 451/41 |
| 7,645,702 B2 * | 1/2010 | Koyata et al. | 438/692 |
| 7,648,576 B2 * | 1/2010 | Fukuda et al. | 117/9 |
| 2002/0127766 A1 * | 9/2002 | Ries et al. | 438/94 |
| 2003/0190810 A1 | 10/2003 | Cooper | |
| 2005/0277278 A1 * | 12/2005 | Maleville et al. | 438/607 |
| 2008/0057324 A1 | 3/2008 | Nakahara et al. | |
| 2009/0304975 A1 * | 12/2009 | Sugimoto et al. | 428/64.1 |

FOREIGN PATENT DOCUMENTS

| | | |
|---|---|---|
| JP | 44-007642 | 4/1969 |
| JP | 4-122023 | 4/1992 |
| JP | 8-017163 | 2/1996 |
| JP | 10-223580 | 8/1998 |
| JP | 2001-127016 | 5/2001 |

(Continued)

OTHER PUBLICATIONS

Search report from E.P.O., mail date is Nov. 29, 2012.

(Continued)

*Primary Examiner* — Lan Vinh
(74) *Attorney, Agent, or Firm* — Greenblum & Bernstein, P.L.C.

(57) ABSTRACT

The method for producing a silicon epitaxial wafer according to the present invention has: a growth step F at which an epitaxial layer is grown on a silicon single crystal substrate; a first polishing step D at which, before the growth step, at least a front surface of the silicon single crystal substrate is polished without using abrasive grains; and a second polishing step G at which at least the front surface of the silicon single crystal substrate is subjected to finish polishing after the growth step.

9 Claims, 5 Drawing Sheets

(56) References Cited

FOREIGN PATENT DOCUMENTS

| | | |
|---|---|---|
| JP | 2001-223163 | 8/2001 |
| JP | 2004-281671 | 10/2004 |
| JP | 2006-120939 | 5/2006 |
| JP | 2008-088051 | 4/2008 |
| KR | 1997-0052720 | 7/1997 |
| KR | 10-0418442 | 2/2004 |
| WO | 2009/081720 | 7/2009 |

OTHER PUBLICATIONS

Japan Office action, mail date is Oct. 2, 2012.
Korea Office action, mail date is Mar. 28, 2013.

\* cited by examiner

FIG. 5
Examples
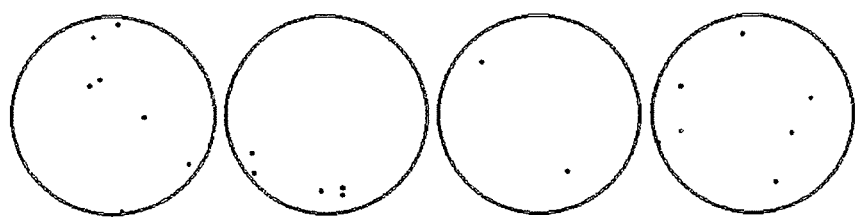
Comparative Examples
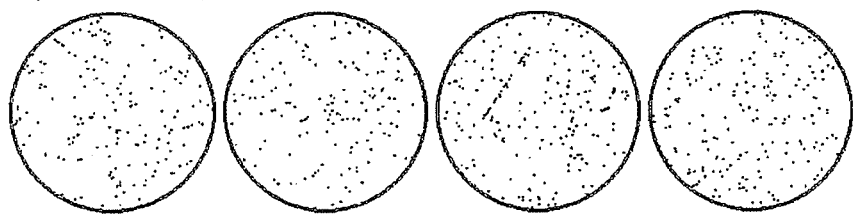

METHOD FOR PRODUCING SILICON EPITAXIAL WAFER

TECHNICAL FIELD

The present invention relates to a method for producing a silicon epitaxial wafer.

BACKGROUND ART

A production method is known which grows a vapor phase epitaxial layer on the surface of a silicon single crystal wafer and then subjects the surface of the epitaxial layer to mirror polishing process (Patent Document 1). According to this production method, crown defects having occurred by the epitaxial growth are allowed to be removed and the flatness of the surface may be achieved.

PRIOR ART DOCUMENTS

Patent Documents

Patent Document 1: Examined Patent Publication No. H8-17163 (1996)

SUMMARY OF THE INVENTION

Problem to be Solved by the Invention

However, the above prior art production method may not solve the problem that the productivity is significantly deteriorated because mirror polishing steps are employed before and after the epitaxial growth step.

Problems to be solved by the present invention include providing a method for producing a silicon epitaxial wafer, in which the high productivity is obtained and epitaxial defects are also allowed to be decreased.

Means for Solving the Problems

The present invention solves the above problems by providing a first double side polishing step at which, before a growth step at which an epitaxial layer is grown on a silicon single crystal substrate, at least a front surface of the silicon single crystal substrate is polished using slurry free from abrasive grains, while providing a second polishing step at which at least the front surface of the silicon single crystal substrate is subjected to finish polishing after the growth step.

Effects of the Invention

According to the present invention, the productivity is allowed to be increased by polishing without using abrasive grains in the first double side polishing step. Moreover, epitaxial defects are allowed to be decreased because damages due to abrasive grains may be decreased.

BRIEF DESCRIPTION OF DRAWINGS

FIG. 5 depicts views illustrating epitaxial defects to be improved by the method in FIG. 1

EMBODIMENTS FOR CARRYING OUT THE INVENTION

Hereinafter, embodiments of the present invention will be described with reference to the drawings.

Figure 1:
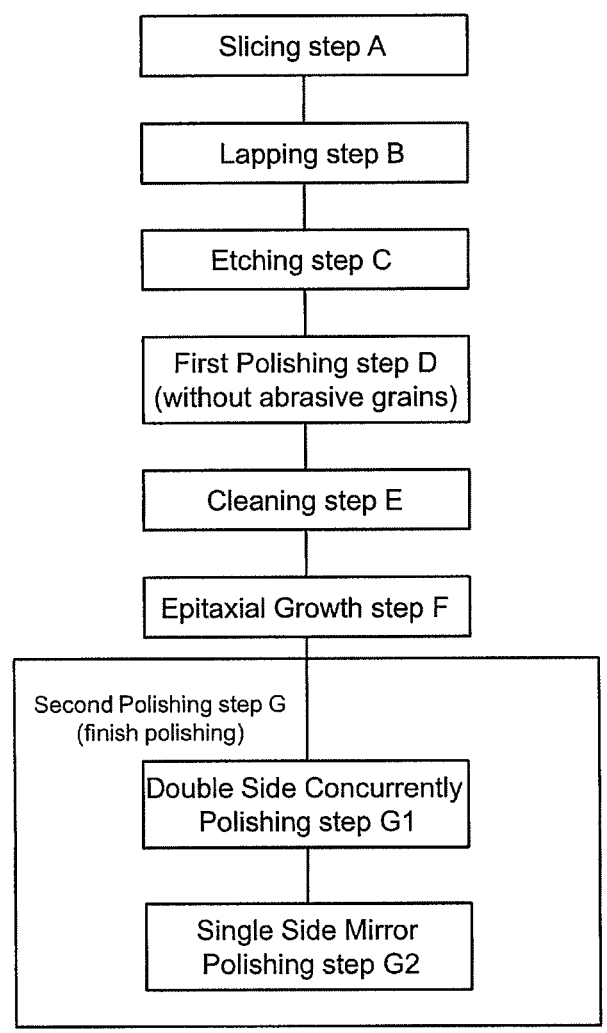
FIG. 1 is a process chart illustrating a method for producing a silicon epitaxial wafer, to which an embodiment of the present invention is applied.

FIG. 1 is a process chart illustrating a method for producing a silicon epitaxial wafer, to which an embodiment of the present invention is applied.

Describing at first one example of a pre-process for slicing step A, using Czochralski pulling up method, a p-type silicon single crystal ingot is produced which has the main axis orientation of <100> and the diameter of 305 mm, and this ingot is peripherally ground into the diameter of 300 mm and then subjected to notch forming thereafter being cut into a plurality of blocks with electrical resistance of 5 to 10 mΩcm.

Note that, as the main axis orientation of the silicon single crystal, other orientations, such as <110>, may be applicable alternatively to <100>. Also note that, as the diameter of the wafer, other diameters, such as 200 mm and 450 mm may be applicable alternatively to 300 mm.

In the slicing step A, each of the above blocks is sliced using a wire saw to provide wafer-like substrates with a certain thickness.

Sliced wafer substrates are subjected to double side grinding in lapping step B thereby to ensure a certain degree of flatness. In the lapping step B, the wafer substrates are interposed between upper and lower grinding surface plates of a double side grinding machine, and both surfaces, i.e. the front surface and the back surface of each wafer substrate are ground while supplying slurry containing abrasive grains.

Wafer substrates having been flattened to a certain degree in the lapping step B are put into etching step C, and grinding damages generated on the surfaces are removed therefrom. Note that wafer substrates may be sent to a chamfering step after the lapping step B, and the shapes of outer faces thereof may be adjusted using grinding stone.

In the producing method according to the present embodiment, first polishing step D is provided which polishes, before epitaxial growth step F, at least front surfaces of the wafer substrates having been completed the etching step C, only by an abrasive cloth and using slurry not containing abrasive grains.

In this first polishing step D, only the front surface of each wafer substrate may be polished, or otherwise both the front surface and the back surface of each wafer substrate may be concurrently polished. In the case of concurrently polishing both surfaces, the wafer substrate is interposed between upper and lower polishing surface plates of a double side polishing apparatus, to which hard polishing pads are attached, and both surfaces of the wafer substrate are polished at the same time under the condition of no abrasive grains.

The polishing amount in this first polishing step D is within the range of 5 to 30 μm, for example. This first polishing step D improves the flatness of wafer substrates and suppresses polishing damages due to abrasive grains from occurring because the polishing is performed without abrasive grains, and defects to be subsequently formed in the epitaxial layer would be reduced.

Note that, after the etching step C and before the first polishing step D, polishing with abrasive grains may be performed to polish the surfaces of the wafer substrates using slurry containing abrasive grains, however, in this case, in order to remove polishing damages due to abrasive grains, it is preferred that the polishing amount in the first polishing step D is set to be 100 nm or more.

After completing the first polishing step D, the wafer substrates are cleaned up to remove polishing residue (cleaning step E) thereafter being sent to the epitaxial growth step F.

In the epitaxial growth step F, before supplying reactive gases into an epitaxial reactor furnace in which wafer substrates are set, halogenated gas may be supplied into the reactor furnace to remove oxidized films having formed on the surfaces of the wafer substrates. Alternatively to the method of etching by supplying halogenated gas into the epitaxial reactor furnace, the cleaning step E may be provided therein with a wet etching step where etching liquid for the oxidized films is dropped onto the wafer substrates.

In the epitaxial growth step F, the wafer substrates are set on susceptors in the epitaxial reactor furnace and the reactive gases are supplied thereby to form epitaxial layers on the surfaces of the wafer substrates.

Wafer substrates having formed thereon with epitaxial layers are sent to second polishing step G to be subjected to finish polishing. Although the second polishing step G is enough to be a step at which at least the front surface of each wafer substrate is subjected to the finish polishing, the second polishing step G according to the present embodiment involves double side concurrently polishing step G1 and subsequent single side mirror polishing step G2. Hereinafter, the double side concurrently polishing step G1 and the single side mirror polishing step G2 will be described as one example of the second polishing step G, but the present invention is not intended to be limited to this.

Figure 2:
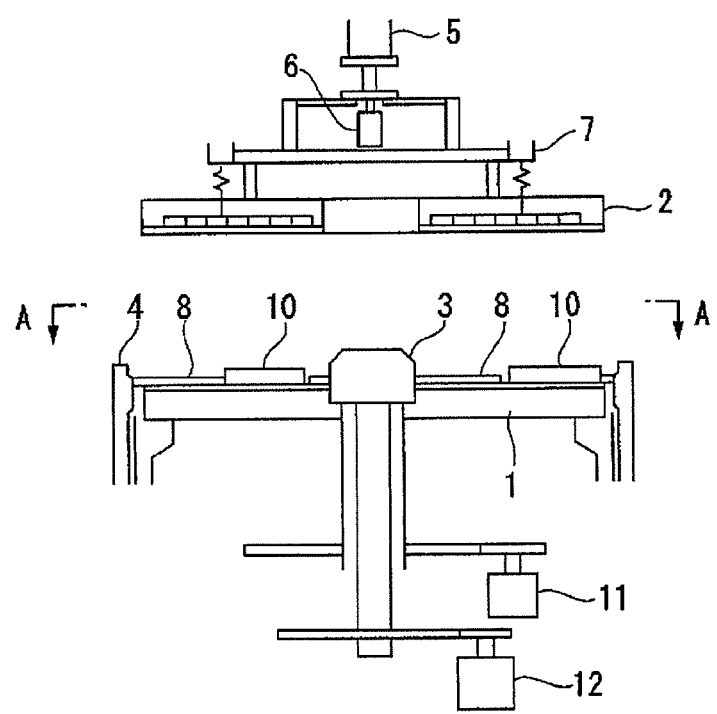
FIG. 2 is a front elevational view illustrating one example of a polishing apparatus which is applied to the double side concurrently polishing step G1 in FIG. 1.
Figure 3:
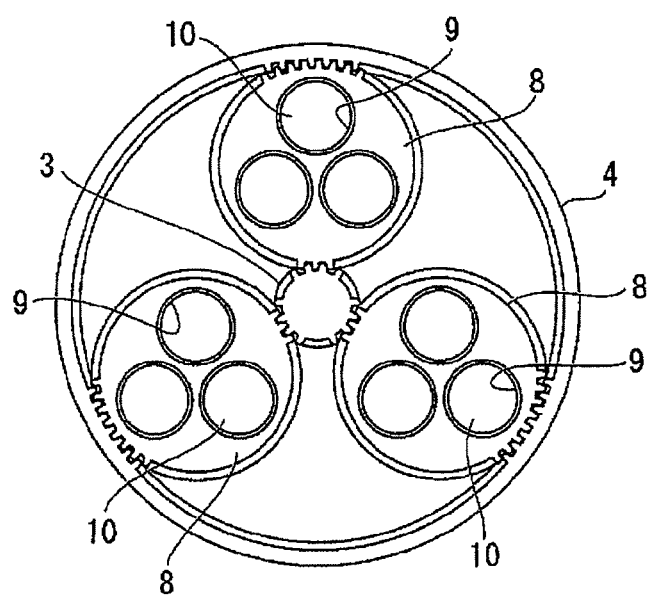
FIG. 3 is a plan view from line A-A in FIG. 2.
Figure 4:
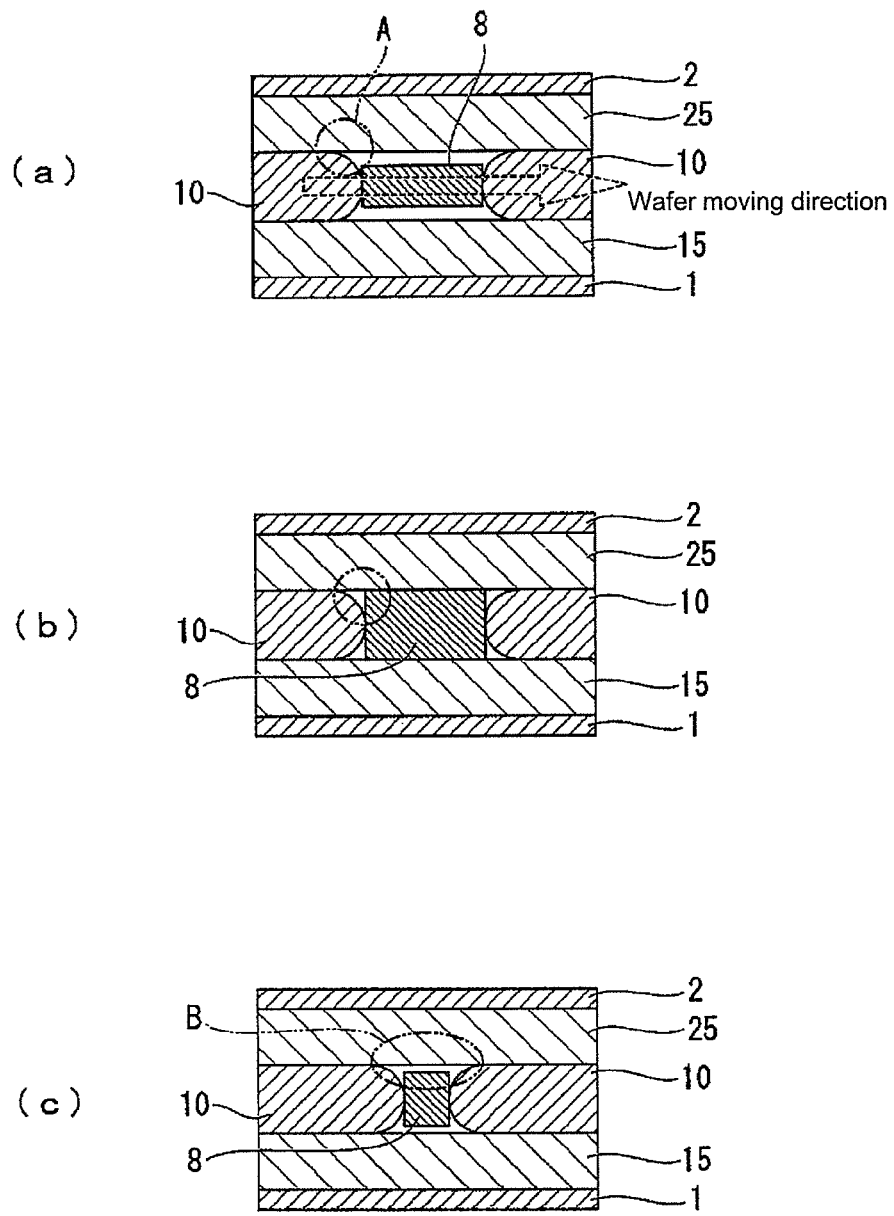
FIG. 4(a) to FIG. 4(c) are schematic cross-sectional views illustrating polishing statuses by the polishing apparatus in FIG. 2.

In the double side concurrently polishing step G1, a double side polishing apparatus and a polishing method as shown in FIG. 2 to FIGS. 4(a) to 4(c) may be employed. Hereinafter, one example of such polishing apparatus used in the double side concurrently polishing step G1 will be described. FIG. 2 is a front elevational view illustrating one example of the polishing apparatus, and FIG. 3 is a plan view from line A-A in FIG. 2.

The polishing apparatus shown in FIG. 2 and FIG. 3 comprises: a circular lower polishing surface plate 1 supported horizontally; a circular upper polishing surface plate 2 facing the lower polishing surface plate 1 from above; a sun gear 3 positioned at the inside of the circular lower polishing surface plate 1; and a ring-like internally-toothed gear 4 positioned at the outside of the lower polishing surface plate 1. In addition, reference numeral 5 denotes a cylinder, reference numeral 6 denotes a joint, reference numeral 7 denotes a tank for polishing liquid, reference numeral 8 denotes carriers, and reference numeral 9 denotes holes for being set therein with wafer substrates 10.

Facing surfaces of the lower polishing surface plate 1 and the upper polishing surface plate 2 are, as shown in FIGS. 4(a) to 4(c), attached thereto pads (abrasive clothes) 15 and 25 each obtained by impregnating urethane resin into nonwoven fabric cloth, or pads (abrasive clothes) 15 and 25 comprised of urethane foams etc.

When performing the polishing of wafer substrates 10, in the status where the upper polishing surface plate 2 is lifted up, a plurality of carriers 8 are set on the lower polishing surface plate 1 and the wafer substrates 10 are set into holes 9 of each carrier 8. The upper polishing surface plate 2 is then caused to move down to apply a predetermined pressing force to each wafer substrate 10. In this status, while polishing liquid is supplied between the lower polishing surface plate 1 and the upper polishing surface plate 2, the lower polishing surface plate 1, the upper polishing surface plate 2, the sun gear 3, and the internally-toothed gear 4 are caused to rotate in predetermined directions with predetermined speeds.

This allows a sun-and-planet motion to run where the plurality of carriers 8 revolve around the sun gear 3 while each rotating between the lower polishing surface plate 1 and the upper polishing surface plate 2. The wafer substrates 10 held by each carrier 8 are contacted and rubbed with the abrasive clothes 15 and 25 in the polishing liquid, and both the upper and the lower surfaces are concurrently polished. Polishing condition is set such that both surfaces of each wafer substrates 10 are evenly polished and the plurality of wafer substrates 10 are evenly polished.

FIGS. 4(a) to 4(c) are schematic cross-sectional views illustrating polishing statuses.

In the conventional polishing technique which involves a polishing step using carriers 8 thinner than wafer substrates 10, pressures from the abrasive clothes 15 and 25 are concentrated at outer edges A of the wafer substrates 10, one of which is denoted by symbol A in FIG. 4(a), thereby causing edge-roll-off to occur in each wafer substrate 10 as a result. In addition, according to the polishing technique described in Jpn. Unexamined Patent Publication No. 2002-254299, as shown in FIG. 4(b), a method is employed in which the pressures to be concentrated at outer edges A are distributed toward the vicinity of wafer substrates 10 and the carriers 8 by enlarging the thickness dimensions of the carriers 8.

In contrast, according to the polishing method of the present embodiment, by closely arranging the holes 9 in the planar arrangement within each carrier 8 to concentrate the locations of the wafer substrates 10 toward the center of each carrier 8, as shown in FIG. 4(c), the polishing pressures from the abrasive clothes 15 and 25 are allowed to be distributed toward adjacent wafer substrates 10 arranged close to each other as denoted by symbol B in FIG. 4(c). Consequently, disadvantages in the conventional technique are suppressed that the productivity may be deteriorated due to decreasing of the polishing rate and that the control of the thickness of carriers may be required, etc, while on the other hand, edge-roll-off of the wafer substrates 10 may be prevented from occurring at the outer edge portions thereof.

This is considered as being due to that the distances among the wafer substrates 10 are made smaller in the status of eliminating the influence from the deformation of carriers 8 by the wafer substrates 10 during polishing, etc. Consequently, the concentration of polishing pressures from the abrasive clothes 15 and 25 on the surfaces of the polishing surface plates 1 and 2 to the wafer substrates 10 is suppressed from occurring in the vicinity of the position where adjacent wafer substrates 10 come to be most close to each other.

During operation of the polishing, at the position between a wafer substrate 10 and another wafer substrate 10, due to the difference in thickness between the wafer substrates 10 and the carrier 8, a status is provided where the abrasive clothes 15 and 25 on the surfaces of the polishing surface plates having flexibility are deformed to outstand toward the carrier 8 from the height (the position in the thickness direction) at the planar position of each wafer substrate 10. For this reason, the pressures from the abrasive clothes 15 and 25 may be concentrated at edge portions of the wafer substrates 10 thereby to increase the polishing amount at the edge portions of the wafer substrates 10.

According to the polishing method of the present embodiment, however, as shown in FIG. 4(c), by making smaller the distance between the wafer substrates 10 (distance between the holes 9), the deformation amount of the abrasive clothes 15 and 25 are allowed to be decreased in the vicinity of the position where adjacent wafer substrates 10 are close to each other. Consequently, the present embodiment allows the pressure concentration at the outer edge portions of the wafer substrates 10 to be alleviated in the vicinity of the outer edge portions of the wafer substrates 10. As a result, the occurrence of edge-roll-off of the wafer substrates 10 may be reduced at the outer edge portions thereof.

This enables to easily and appropriately perform the polishing to a predetermined amount and to easily perceive the ending point of polishing, and to avoid the polishing pressure degradation to the wafer substrates 10 due to the decreasing of the pressure from the polishing surface plates to the carriers 8 even if during the latter half of the polishing step thereby to prevent the operation time efficiency/polishing efficiency from deteriorating, and also prevents the carriers 8 from being polished thereby to obtain long life-time thereof, and additionally avoids the flatness deterioration and the like by preventing the occurrence of edge-roll-off thereby enabling to produce the wafer substrates 10 having high flatness.

Moreover, during the polishing operation, in the vicinity of the border, as the outer edge portion of each wafer substrate 10, between the wafer substrate 10 and the carrier 8, due to the difference in thickness between the wafer substrate 10 being polished and the carrier 8, the abrasive clothes 15 and 25 on the surfaces of the polishing surface plates having flexibility are deformed to outstand toward the carrier 8 from the height (the position in the thickness direction) at the planar position of the wafer substrate 10. Consequently, the pressures from the abrasive clothes 15 and 25 may be concentrated in the vicinity of the edge portion of the wafer substrate 10 along the entire length of the outer edge portion of the wafer substrate 10, thereby to possibly cause the occurrence of the edge-roll-off of the wafer substrate 10.

According to the polishing method of the present embodiment, however, through decreasing the distances among the wafer substrates 10 to be subjected to the double side polishing and causing the wafer substrates 10 to be close to one another, it is enabled to approach the status where the wafer substrates 10 positioned in three holes 9 within one carrier 8 are polished as if they are of one wafer substrate 10. This allows to limit the length where the stress concentration occurs relative to the entire outer edge length of one wafer substrate 10, that is, to reduce the area where the polishing condition within the outer edge portion of the wafer substrate 10 becomes to be significant because the pressures from the abrasive clothes 15 and 25 on the surfaces of the polishing surface plates 1 and 2 having flexibility are concentrated at the outer edge portion of the wafer substrate 10 due to the difference in thickness between the wafer substrate 10 and the carrier 8. Consequently, the polishing pressure concentration is allowed to be alleviated for the entire length of the edge portion of one wafer substrate 10 at the time of completing the polishing, and the occurrence of the edge-roll-off along the outer edge portion of each wafer substrate 10 is also allowed to be reduced.

Although the depicted example employs the configuration involving three carriers 8, other number thereof may also be applicable, and other than this, any configuration of a part of the polishing apparatus may also be applicable so long as the arrangement of the holes 9 or the wafer substrates 10 within each carrier 8 complies with the above constitution.

Referring again to FIG. 1, in the double side concurrently polishing step G1 of the second polishing step G, it is preferred that the polishing amount for the back surface of a silicon epitaxial wafer substrate is equal to or more than the polishing amount for the front surface. For example, it is preferred that the polishing amount for the front surface of a wafer substrate is within the range of 0.01 to 0.1 μm, and the polishing amount for the back surface is within the range of 0.1 to 1.0 μm.

In the subsequent single side mirror polishing step G2, the front surface of the wafer substrate is subjected to a mirror polishing. The polishing amount in the mirror polishing is, for example, 0.01 to 0.2 μm.

As described above, according to the method for producing a silicon epitaxial wafer in the present embodiment, the flatness of the wafer substrate is ensured by the first polishing step D to be performed before the epitaxial growth step F, and epitaxial defects may be reduced because polishing damages scarcely occurs due to the polishing not using abrasive grains.

On the other hand, according to the double side concurrently polishing step G1 to be performed after the epitaxial growth step F, the haze level of the surface of a wafer is improved. At the same time, the double side concurrently polishing step G1 after the epitaxial growth may remove hitting flaws caused by susceptors in the epitaxial reactor furnace, which may occur on the back surface of the wafer, and also remove the depositions onto the back surface, thereby suppressing the degradation of flatness and/or the occurrence of particles due to such flaws and depositions.

Moreover, the double side concurrently polishing step G1 after the epitaxial growth allows the polishing amount of the wafer surfaces to be small as much as possible to the extent of removing oxidized layers on the surfaces, thereby maintaining the thickness of the epitaxial layers on the surfaces to be even.

The upper of FIG. 5 depicts four silicon wafers produced by the production method according to the present embodiment as illustrated in FIG. 1, wherein an average of six epitaxial defects per one silicon wafer is observed. In contrast, the lower of FIG. 5 depicts four silicon wafers as comparative examples by using slurry containing abrasive grains in the first polishing step D as illustrated in FIG. 1, wherein an average of 220 epitaxial defects per one silicon wafer is observed.

It is to be noted that the embodiments as explained above are described to facilitate understanding of the present invention and are not described to limit the present invention. Therefore, it is intended that the elements disclosed in the above embodiments include all design changes and equivalents to fall within the technical scope of the present invention.

For example, although the double side concurrently polishing step G1 is provided after the epitaxial growth step F in the above embodiments, this double side concurrently polishing step G1 may be omitted in the present invention. More specifically, it is enough to polish at least the front surface of a silicon single crystal substrate using slurry not containing abrasive grains in the first polishing step D and thereafter to perform epitaxial growth on that surface, and the subsequent double side concurrently polishing step G1 may thus be omitted. This allows for further improving the productivity.

DESCRIPTION OF REFERENCE NUMERALS

1 . . . lower polishing surface plate
2 . . . upper polishing surface plate
3 . . . sun gear
4 . . . internally-toothed gear
8 . . . carrier
9 . . . hole
10 . . . silicon wafer substrate

The invention claimed is:

1. A method for producing a silicon epitaxial wafer, comprising:
   a growth step at which an epitaxial layer is grown on a silicon single crystal substrate;
   a first polishing step at which, before the growth step, at least a front surface of the silicon single crystal substrate is polished only by an abrasive cloth, and using a slurry free of abrasive grains; and
   a second polishing step at which at least the front surface of the silicon single crystal substrate is subjected to finish polishing after the growth step.

2. The method for producing a silicon epitaxial wafer as set forth in claim 1, further comprising
   a polishing step at which a polishing is performed by using abrasive grains before the first polishing step.

3. The method for producing a silicon epitaxial wafer as set forth in claim 2, wherein
   a polishing amount in the first polishing step is 100 nm or more.

4. The method for producing a silicon epitaxial wafer as set forth in claim 1, wherein
   the second polishing step has: a first step at which both main surfaces of the silicon single crystal substrate are polished; and a second step at which the front surface of the silicon single crystal substrate is subjected to mirror polishing.

5. The method for producing a silicon epitaxial wafer as set forth in claim 4, wherein
   a polishing amount for a back surface of the silicon single crystal substrate in the second step is equal to or more than a polishing amount for the front surface.

6. The method for producing a silicon epitaxial wafer as set forth in claim 5, wherein
   the polishing amount for the back surface is 0.1 to 1.0 μm.

7. The method for producing a silicon epitaxial wafer as set forth in claim 1, wherein
   only the front surface of the silicon single crystal substrate is subjected to mirror polishing in the second polishing step.

8. The method for producing a silicon epitaxial wafer as set forth in claim 1, wherein
   the growth step includes etching step at which, before growing the epitaxial layer, oxidized films having formed on surfaces of the silicon single crystal substrate are removed by halogenated gas.

9. The method for producing a silicon epitaxial wafer as set forth in claim 1, further comprising
   an etching step at which surfaces of the silicon single crystal substrate are subjected to wet etching process between the first polishing step and the growth step.

* * * * *